(12) United States Patent  
McKeever et al.

(10) Patent No.: US 8,231,323 B2  
(45) Date of Patent: Jul. 31, 2012

(54) ELECTRONIC COMPONENT HANDLER HAVING GAP SET DEVICE

(75) Inventors: David James McKeever, Beaverton, OR (US); Martin Frederick Bamberger, Beaverton, OR (US); Blaine Michael, Beaverton, OR (US); Doug J. Garcia, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 1259 days.

(21) Appl. No.: 11/742,262

(22) Filed: Apr. 30, 2007

(65) Prior Publication Data

US 2008/0181751 A1  Jul. 31, 2008

Related U.S. Application Data

(60) Provisional application No. 60/887,126, filed on Jan. 29, 2007.

(51) Int. Cl.  
*B65G 1/00*    (2006.01)

(52) U.S. Cl. .................................. 414/222.05; 324/158.1
(58) Field of Classification Search ................. 324/158.1  
See application file for complete search history.

(56) References Cited

U.S. PATENT DOCUMENTS

| | | |
|---|---|---|
| 5,568,870 A | 10/1996 | Utech |
| 5,842,579 A | 12/1998 | Garcia et al. |
| 6,194,679 B1 | 2/2001 | Garcia et al. |
| 6,906,508 B1 | 6/2005 | Saulnier et al. |
| 2006/0232279 A1 | 10/2006 | Garcia et al. |

*Primary Examiner* — Saul Rodriguez  
*Assistant Examiner* — Willie Berry, Jr.  
(74) *Attorney, Agent, or Firm* — Young Basile

(57) ABSTRACT

A gap set device for an electronic component handler is provided. The electronic component handler includes a linear bearing having a test accessory mounted to it. The test accessory is movable between a first position away from a tool and a second position closer to the tool. A setting post is extendable from the test accessory such that when the test accessory moves from the first position to the second position the setting post can fix a gap between the test accessory and the tool.

18 Claims, 8 Drawing Sheets

US 8,231,323 B2

ELECTRONIC COMPONENT HANDLER HAVING GAP SET DEVICE

CROSS-REFERENCE TO RELATED APPLICATIONS

This application claims priority to U.S. Provisional Application No. 60/887,126, filed Jan. 29, 2007.

FIELD OF THE INVENTION

This invention relates to setting a predefined and repeatable gap between an electronic component tool and an electronic component test accessory.

BACKGROUND

Electronic components are handled by a wide variety of different electronic component handlers. These different handlers include but are not limited to products sold by Electro Scientific Industries Inc. of Portland, Oreg., the assignee of the present patent application. Electro Scientific Industries sells a variety of electronic component handlers including, but not limited to, a high volume MLCC tester sold as the model No. 3300, a chip array tester sold as the model No. 3400, a visual test system sold as the model No. 6650, and a chip array terminator sold as the model No. 753.

One such electronic component testing machine is described in prior art U.S. Pat. No. 5,842,579 entitled Electrical Circuit Component Handler. With reference to FIG. 2, there is shown an overall pictorial view of the electrical circuit component handler of U.S. Pat. No. 5,842,579, the entirety of which is incorporated herein by reference. FIG. 2 illustrates a handler 10 having a plurality of test accessories thereon including a loading, or load, frame 12, a plurality of test modules 14 and a blowoff module 16. In operation, electronic components are passed through load frame 12 and are individually drawn into test seats 22 found on a test plate 20. Test seats 22 typically are concentric rings that are continuous about test plate 20.

With more specific reference to load frame 12 and with specific reference to FIG. 2A, load frame 12 includes a plurality of arcuate fences 13. Arcuate fences 13 allow electronic components 11 to be collected adjacent fences 13 as shown. The bases of arcuate fences 13 are slightly spaced above test plate 20 as to prevent passing or catching of electronic components beneath arcuate fences 13. The spacing between the arcuate fences 13 and test plate 20 defines a gap labeled by the letter A. U.S. Pat. No. 5,842,579 indicates that the gap A is set by shims.

Test plate 20 indexes in a direction toward test modules 14 as indicated by Arrow B as shown in FIG. 2. The electronic components are tested by test modules 14. As test plate 20 continues to index the electronic components are then withdrawn from the component handler 10 by the blowoff module 16.

With continued reference to U.S. Pat. No. 5,842,579, it may be necessary to change test plate 20. For example, test plate 20 may require changing if it becomes worn or by way of another example, test plate 20 may be changed to accommodate handling of different types of electronic components. In such situations, the test accessories, such as load frame 12, must be moved out of the way so that the old test plate may be removed and the new test plate added. The test accessories must then be put back in place setting a proper gap between the test accessories and test plate. As described in U.S. Pat. No. 5,842,579, this gap, and in particular the gap between the load frame and the test plate, was set by using shims. The exclusive use of shims is time consuming and cumbersome.

SUMMARY OF THE INVENTION

An electronic component handler is provided. The handler includes a removable tool received on the handler. A linear bearing is mounted to the handler, and a test accessory is mounted to the linear bearing with the test accessory movable between a first position and a second position. A setting post is mounted to the test accessory, the setting post extendable to define a gap between the test accessory and the tool when the test accessory is in its second position.

In a preferred embodiment the removable tool may be a test plate and the test accessory may be a load frame. When the test accessory is a load frame, the load frame may include a plurality of arcuate fences and the test plate may include a plurality of concentric test seat rings. The preferred embodiment may include micrometers to radially and axially adjust the load frame to bring at least one of the load frame fences into alignment with at least one of the test set rings.

In a preferred embodiment a kinematic mount may also be provided. The kinematic mount is operable in adjusting a plane associated with the test accessory. In a preferred embodiment the setting post may be an air cylinder having a passage for air flow therein. When the setting post comes in close contact with the test plate the air flow is obstructed and the gap may be set.

A method of changing a first tool for a second tool on an electronic component handler is also provided. In the method the electronic component handler includes a test accessory mounted to a linear bearing. The test accessory is movable between a first position and a second position. The method includes moving the test accessory away from the first tool and replacing the first tool with the second tool. A setting post is extended from the test accessory and the test accessory is moved toward the second tool so that the setting post is proximate the second tool. The test accessory is locked into place, and the setting post is retracted.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION OF THE PREFERRED EMBODIMENTS

With reference to the Figures, wherein like elements are numbered alike, there is shown a gap set device for use with an electrical circuit component handler. Electronic component handlers sometimes include a moving test component, for example a test plate that holds electronic components. A stationary piece, typically a test accessory, sits adjacent the moving test component. In systems such as that described in U.S. Pat. No. 5,842,579 the gap, for example between the stationary load frame 12 and the moving test plate 20, is set with the exclusive use of shims. Shims are difficult to handle and create a time consuming effort to set a gap.

The preferred embodiments are described with reference to the electrical circuit component handler illustrated in U.S. Pat. No. 5,842,579 and in particular describe an apparatus and method used to set the gap between a load frame 12 and a test plate 20. The present invention is not limited for use with load frames and test plates. The present invention applies equally to other electronic component handling devices, for example the devices sold by Electro Scientific Industries as model Nos. 6650, 3400 and 753.

With respect to the electronic component handler of U.S. Pat. No. 5,842,579, the load frame 12 is mounted on a linear bearing. The linear bearing allows the load frame to move vertically away from the test plate such that the test plate may be replaced. A retractable setting post can extend beneath the load frame such that when the load frame is lowered back into position, by sliding the load frame down the linear bearing, the gap between the load frame fences and the test plate will be determined by the amount the setting post extends beyond the load frame fences. After the gap has been set the load frame may be locked into place and the setting post retracted out of the way. As described herein, examples of setting posts include hollow air cylinders and micrometers.

Figure 1:
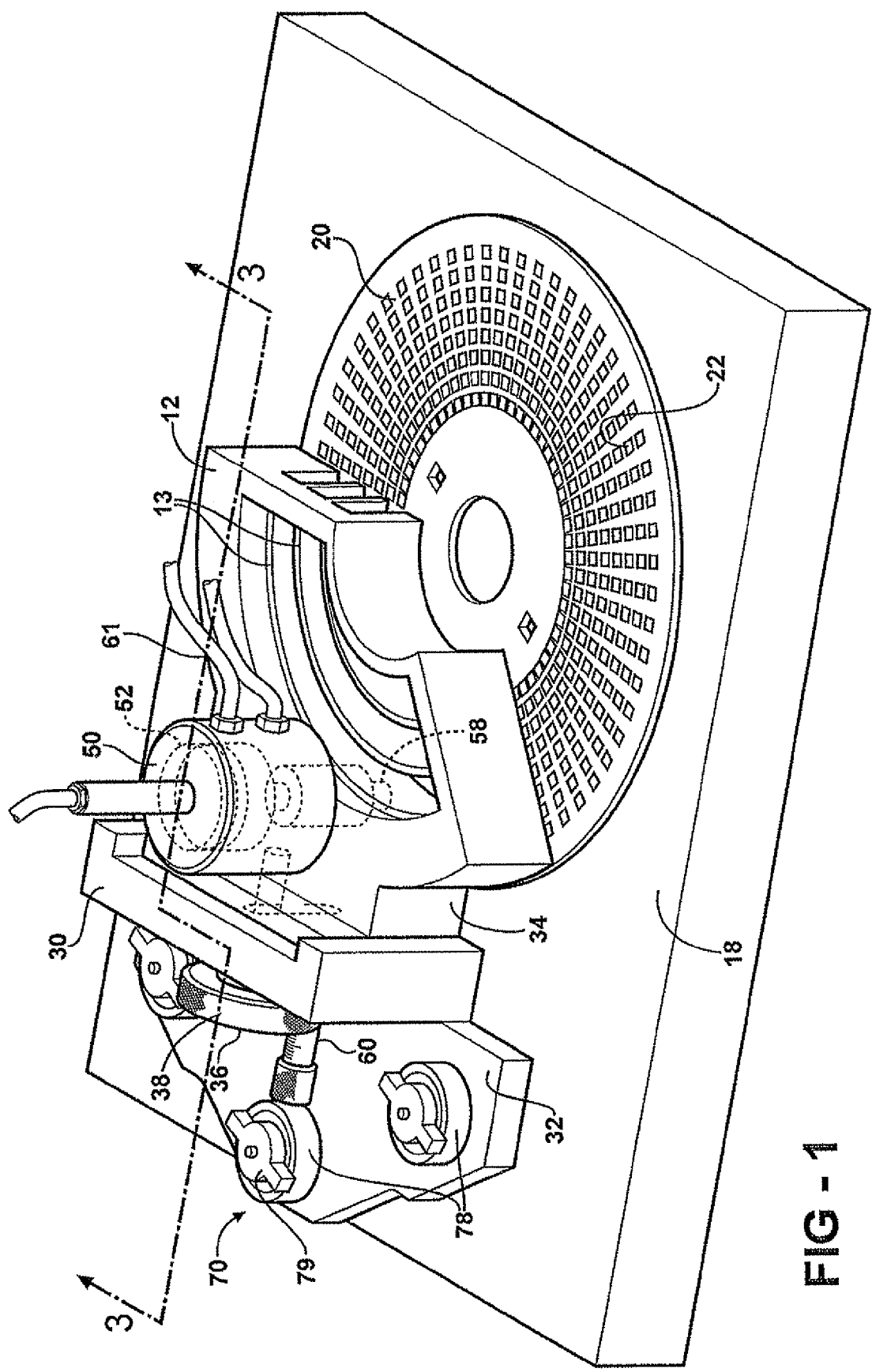
FIG. 1 is an exploded perspective view of a gap set device that allows a repeatable gap to be set between a load frame and a test plate.
Figure 2:
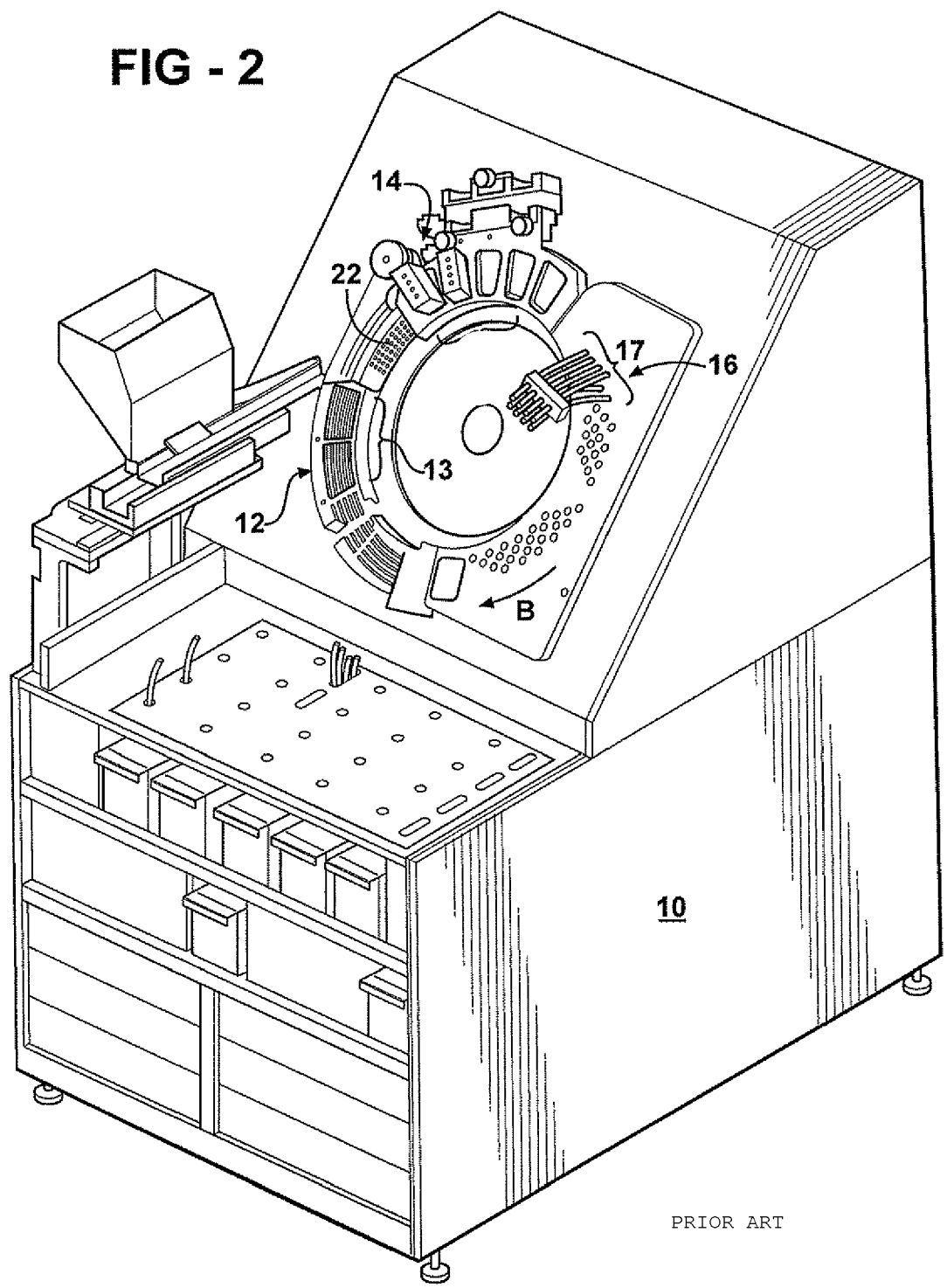
FIG. 2 illustrates a perspective drawing of a prior art electronic component handler.
Figure 2A:
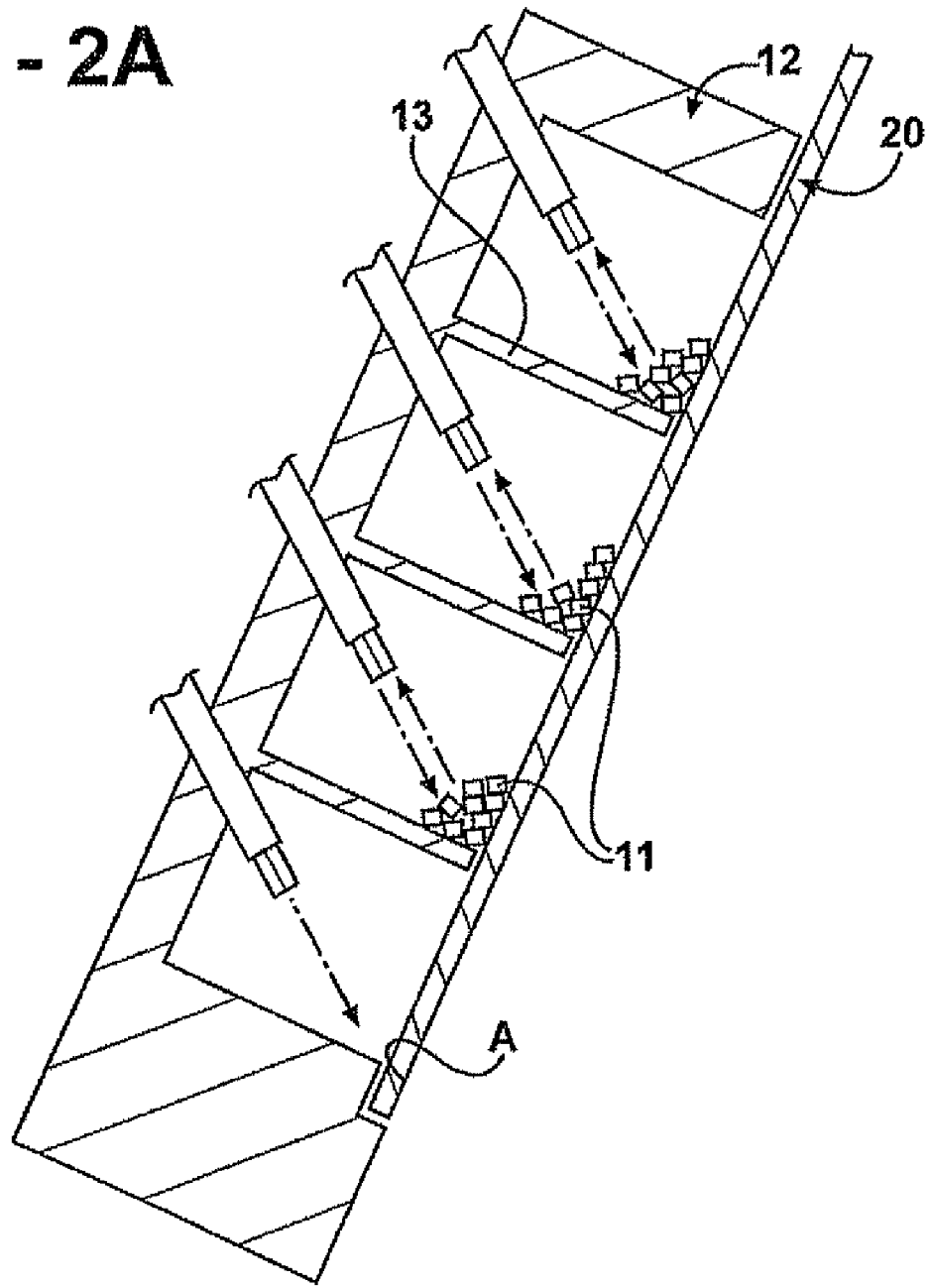
FIG. 2A is a cross section of a load frame illustrating electronic component and arcuate fences.

With reference to FIG. 1 there is shown an exploded perspective view of an electronic component handler utilizing a test plate 20. Test plate 20 includes plurality of concentric test rings 22. Electronic components are delivered into test rings 22 through the use of a load frame 12. Load frame 12 includes a plurality of arcuate fences 13. The arcuate fences 13 are operable to deliver electronic components 11 to an area adjacent test seats 22 as illustrated in FIG. 2A.

With continued reference to FIG. 1, test frame 12 is mounted to a linear bearing 30. Linear bearing 30 includes a base 32. As shown, base 32 is connected to a base plate 18 of handler 10 by a kinematic mount 70. As shown, load frame 12 is slidably received into bearing 30 via a guide 34. Guide 34 may be integral with load frame 12 or may be a separate component.

As shown in FIG. 1, a setting post 50 is mounted to load frame 12. Setting post 50 may be positioned in a variety of places on load frame 12, including but not limited to guide 34. In the first preferred embodiment, setting post 50 includes an air cylinder 52 having an extendable shaft 58. Alternatively, the setting post 50 could be a micrometer.

Figure 7:
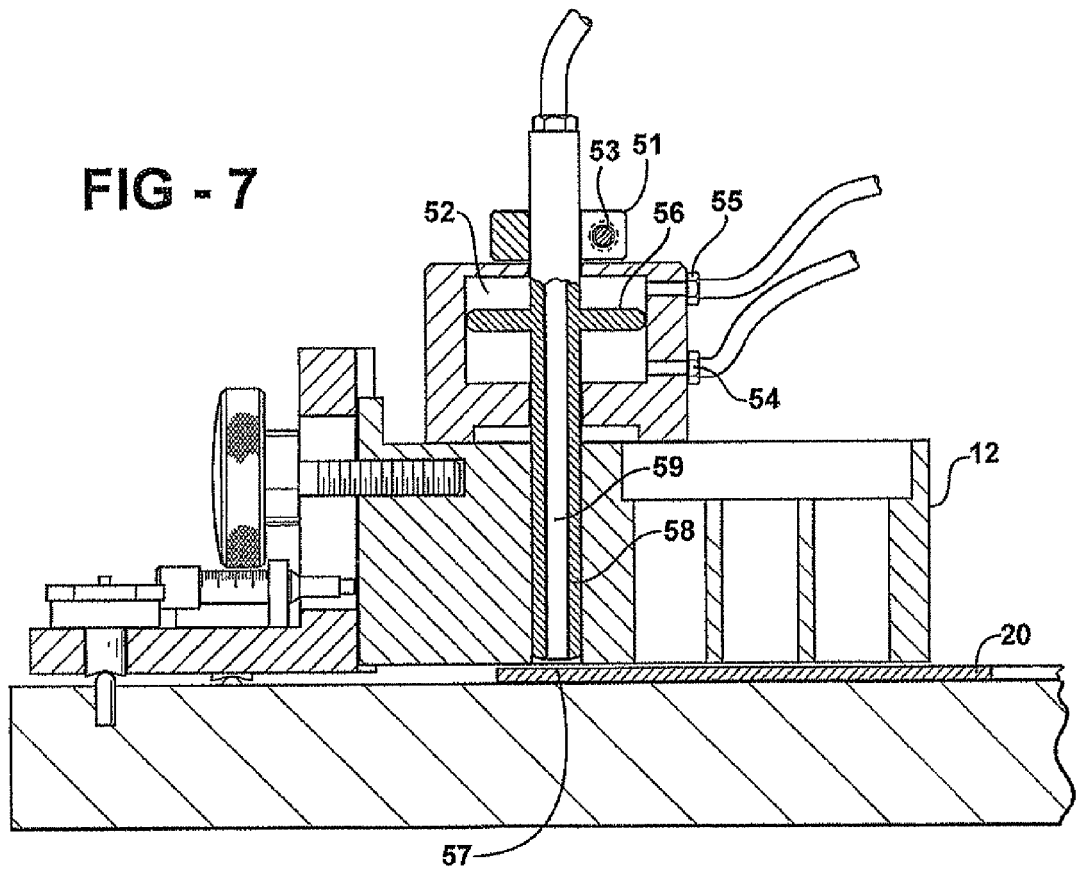
FIG. 7 illustrates a hollow pneumatic airshaft for use with the first preferred embodiment.

As shown in more detail in FIG. 7, air cylinder 52 includes an air inlet 54 and an air outlet 55. Air hoses attach to each of inlet and outlet 54 and 55 to deliver air to cylinder 52 and actuate shaft 58. The distance that shaft 58 extends from air cylinder 52 is adjustable through a collar 51. Collar 51 includes fasteners 53 that may be loosened to allow collar 51 repositioning, thereby adjusting the distance shaft 58 extends from air cylinder 52. As shown, shaft 58 includes an internal passage 59 through which air flows via a pneumatic coupling 56. As described in greater detail below, as the distal end 57 of shaft 58 approaches test plate 12 the air flow through passage 59 is obstructed. This obstruction is detected and allows a gap to be set between load frame 12 and test plate 20.

With further reference to FIG. 1, shaft 58 is extendable beneath/beyond fences 13 of load frame 12. With shaft 58 in its extended position load frame 12 may be lowered toward test plate 20 by linear bearing 30. When shaft 58 comes in close proximity with test plate 20, the airflow through the hollow portion 59 of shaft 58 is obstructed. At this point a lock 36 may be engaged to lock load frame 12 into place. As shown, lock 36 includes a knob 38 for manual actuation. An automated lock may also be used. By extending shaft 58 a known distance past the bottom of fences 13 the gap between load frame 12 and test plate 20 may be accurately and repetitiously set. In the first preferred embodiment the gap can be set to approximately 25 microns. Generally, a gap between 1 and 50 microns would be acceptable for a wide range of different electronic components.

With further reference to FIG. 1, it may be desirable for some purchasers of the device of the first preferred embodiment to radially and axially align fences with corresponding concentric test seat rings 22. As shown, such radial and axial alignment may be adjusted through the actuation or adjustment of micrometers 60. As further shown in FIG. 1, a borescope access hole 61 may be provided to enable an operator to place a borescope, not shown, into access hole 61 to visually inspect the gap between load frame 12 and test plate 20 as well as the alignment of fences 13.

Figure 8:
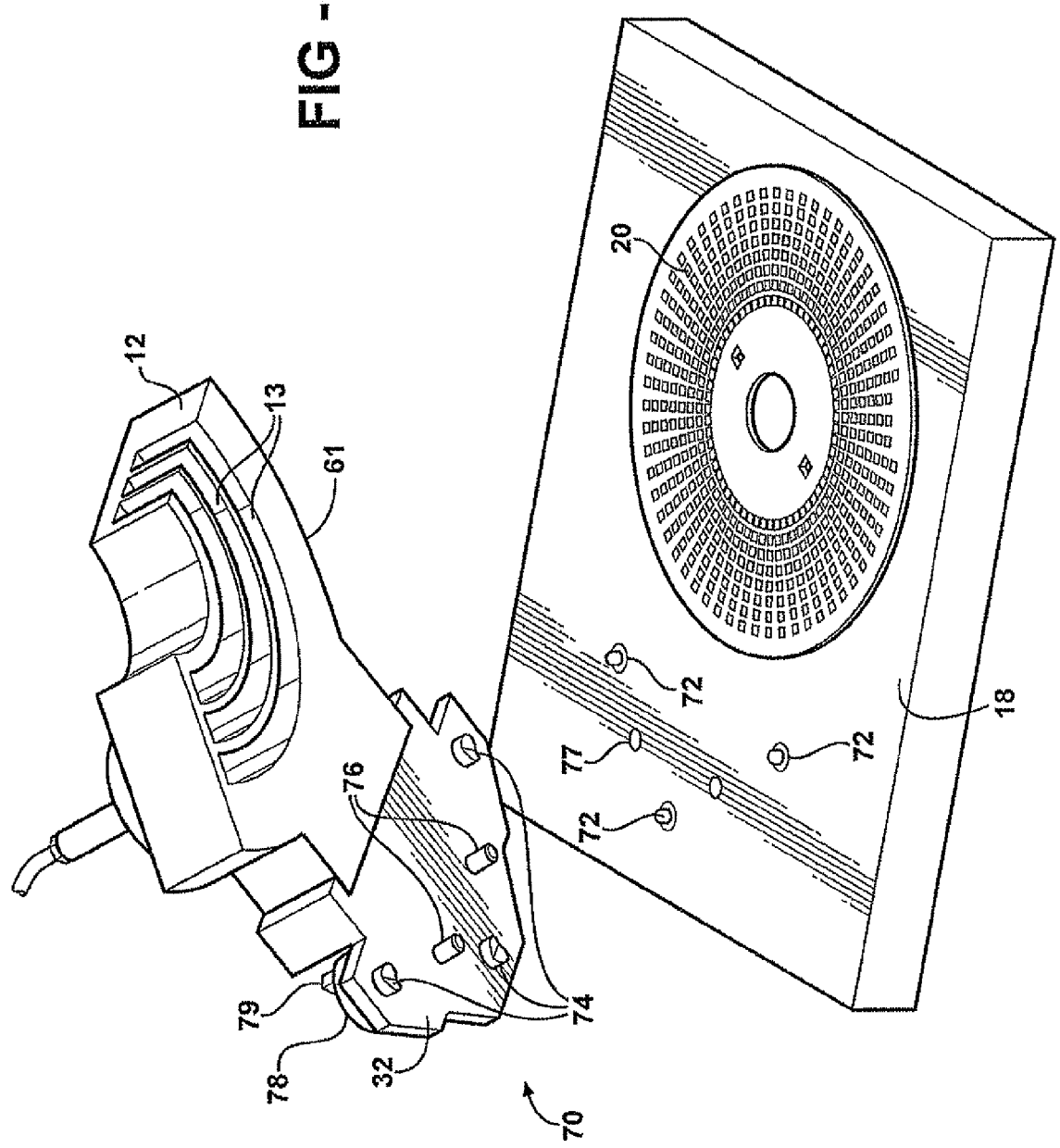
FIG. 8 illustrates an exploded reference perspective of a load frame mounting to a base plate.

With reference to FIG. 8, test plate 20 is planar. Similarly, the underside of load frame 12, and in particular the bottom edges of fences 13, define a plane. In the preferred embodiment, kinematic mount 70 allows the plane defined by fences 13 to be adjusted to be coplanar with the plane defined by test plate 12. Kinematic mount 70 includes pins 72 located on base plate 18 of handler 10. Pins 72 engage corresponding adjustable mounts 74 positioned on base 32. In the first preferred embodiment, kinematic mount 70 further includes a pair of pins 76 that fit into holes 77. Pins 76 cooperate with holes 77 to prevent base 32 from sliding on handler 10.

Figure 9:
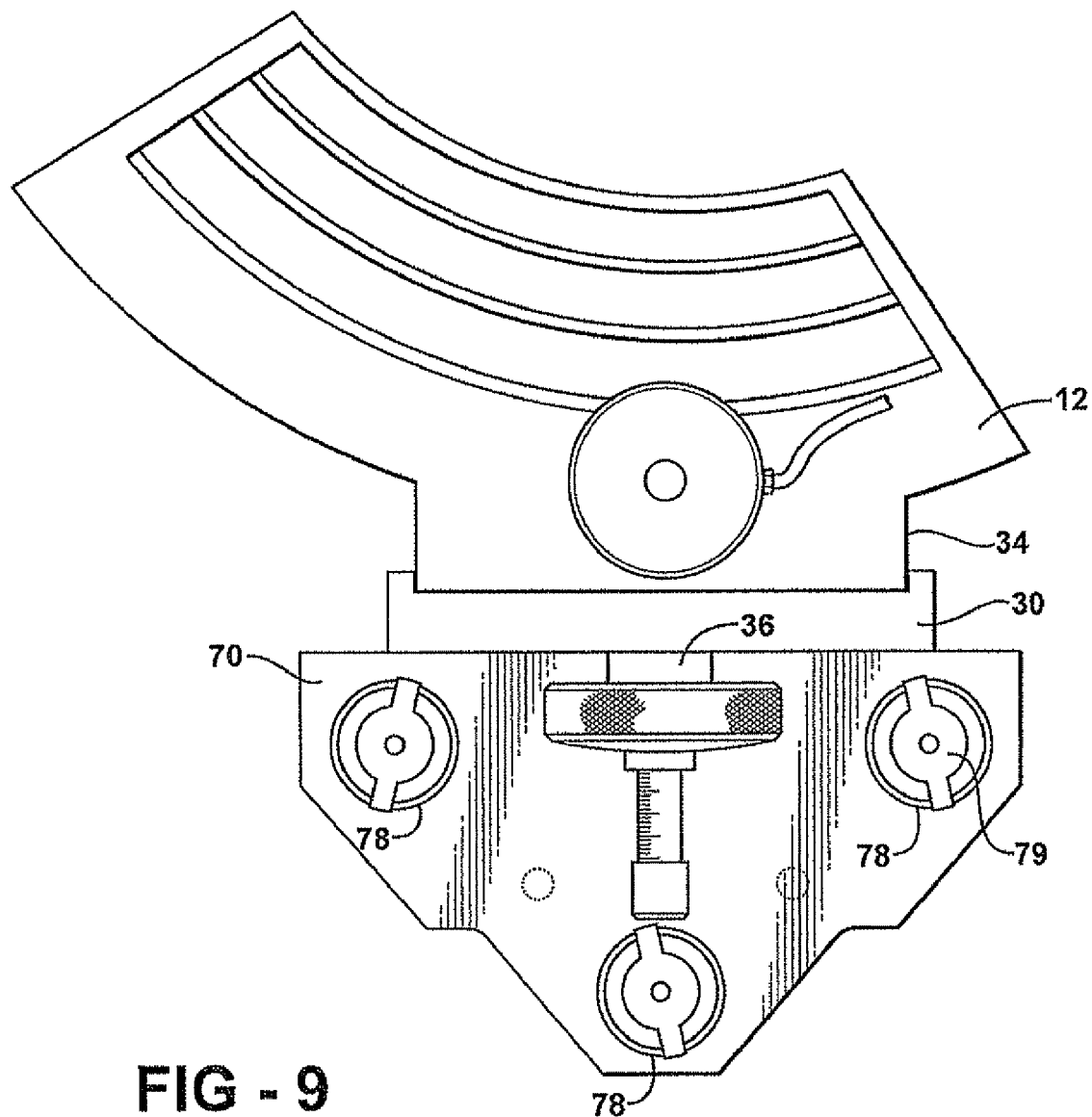
FIG. 9 illustrates a kinematic adjustment to adjust the planarity of a load frame in the first preferred embodiment.

With reference to FIG. 9, the depth of each mount 74 can be changed by adjusting shaft assemblies 78. Shaft assemblies 78 include precision adjusting knobs 79 to accomplish an adjustment of the plane defined by the underside of fences 13. To facilitate a more precise coplanar relationship between the plane of test plate 12 and the plane defined by the underside of fences 13, a borescope, not shown, may be placed into borescope access 61 for visual inspection.

Figure 3:
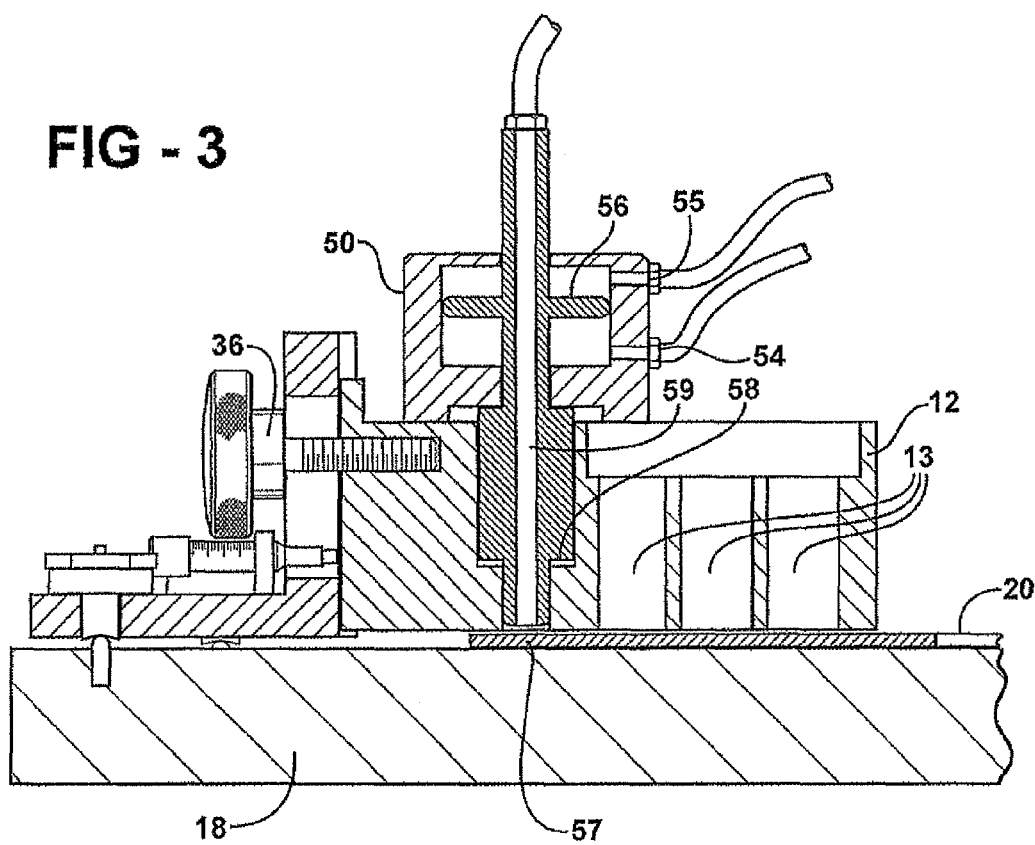
FIG. 3 illustrates a cutaway view of gap set device of FIG. 1 taken along lines 3-3.

With reference to FIGS. 3-6 there is shown a series of cutaway illustrations taken along line 3-3 of FIG. 1 that illustrate a first proposed sequence of operation of the gap setting device. As shown in FIG. 3, load frame 12 is spaced away from test plate 20. This allows test plate 20 to be removed from base plate 18 of handler 10. After a replacement test plate has been mated to base plate 18, air cylinder 52 is actuated to extend shaft 58 beyond the plane defined by fences 13 of test frame 12. An air flow is initiated through passage 59. As shown in FIG. 3, lock 36 is in an unlocked position, indicating that load frame 12 will shortly be moved in a direction toward test plate 20. Load frame 12 may be locked by lock 36 in its upper position.

Figure 4:
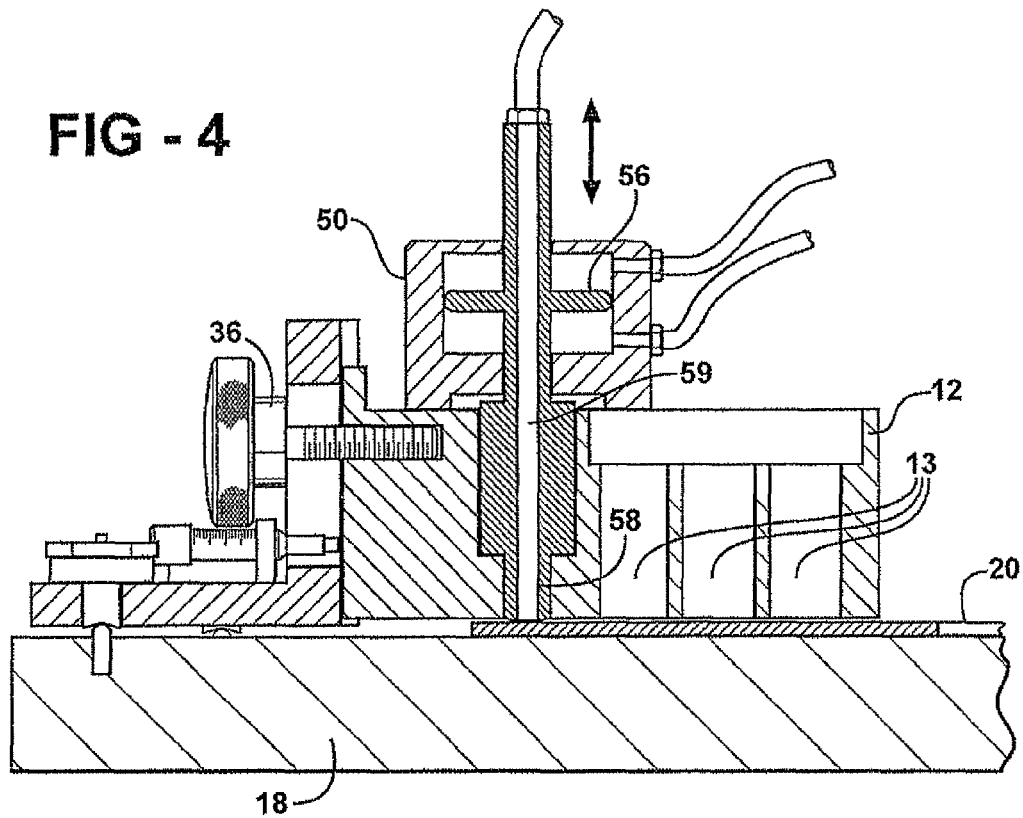
FIG. 4 illustrates a cutaway view of the gap set device of FIG. 1 in a different operational position.
Figure 5:
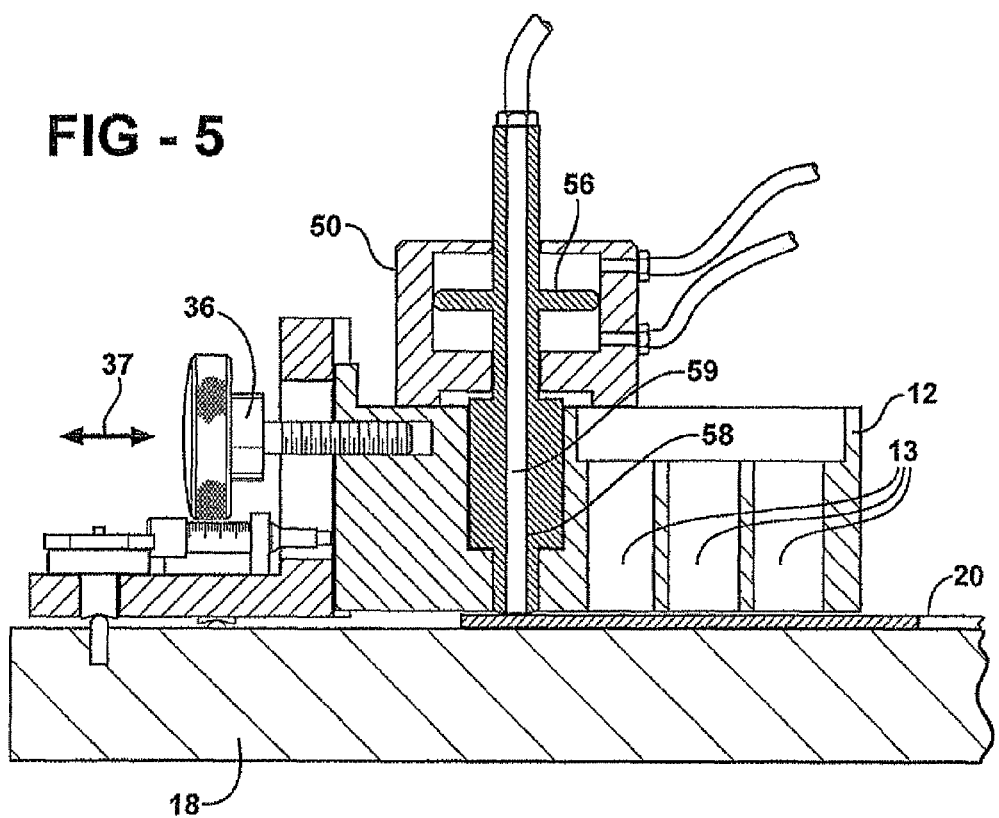
FIG. 5 illustrates a cutaway view of the gap set device of FIG. 1 in a third operational position.

With reference to FIG. 4, load frame 12 is moved to be adjacent to test plate 20. Because shaft 58 extends beyond the plane defined by fences 13, shaft 58 will come into close proximity of load frame 12 prior to fences 13. As shaft 58 gets in close proximity with test plate 12, the air flow through passage 59 will become obstructed. This obstructed air flow may be detected such that lock 36 may be engaged as shown by arrow 37 in FIG. 5. Obstruction of air flow may be indicated by a visual or audible alarm informing a user to actuate lock 36 to set the gap between test plate 12 and fences 13. Alternatively, obstruction of air flow through passage 59 may cause an automated lock to fix the gap.

Figure 6:
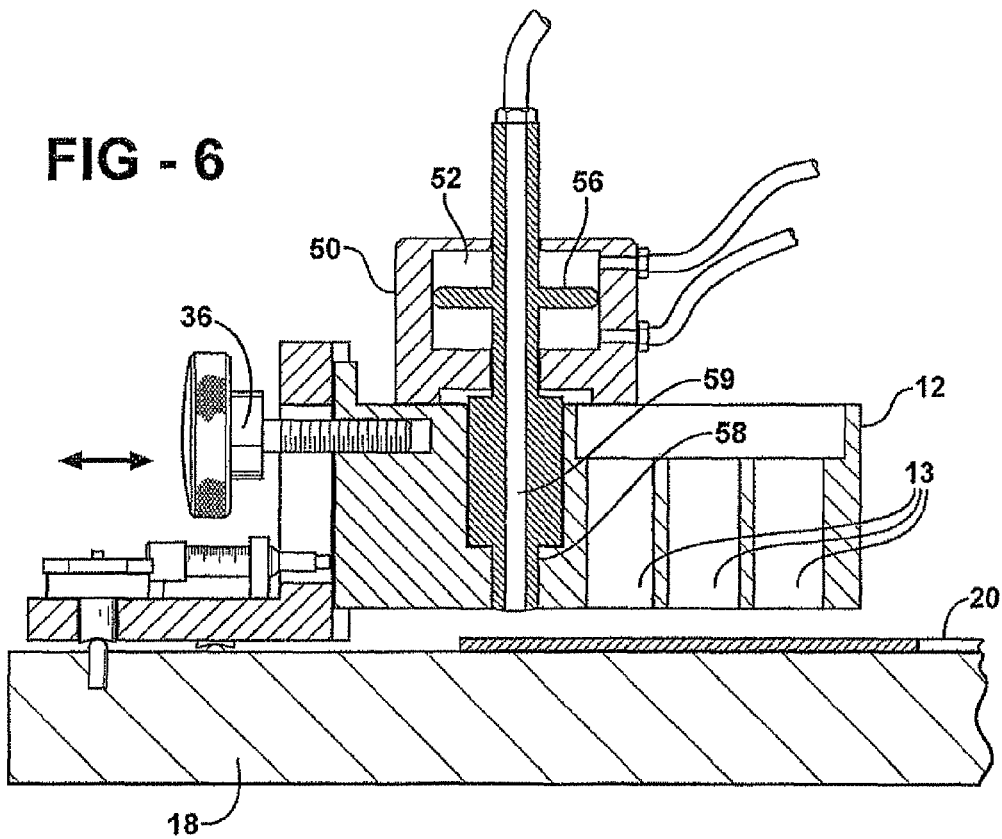
FIG. 6 illustrates a cutaway view of the gap set device of FIG. 1 in a fourth operational position.

With reference to FIG. 6, it is shown that after the gap has been set by setting post 50 and shaft 58, air cylinder 52 is actuated to retract setting post. Retraction of setting post 50 allows test plate 20 to freely rotate without obstruction from shaft 20.

Figure 6A:
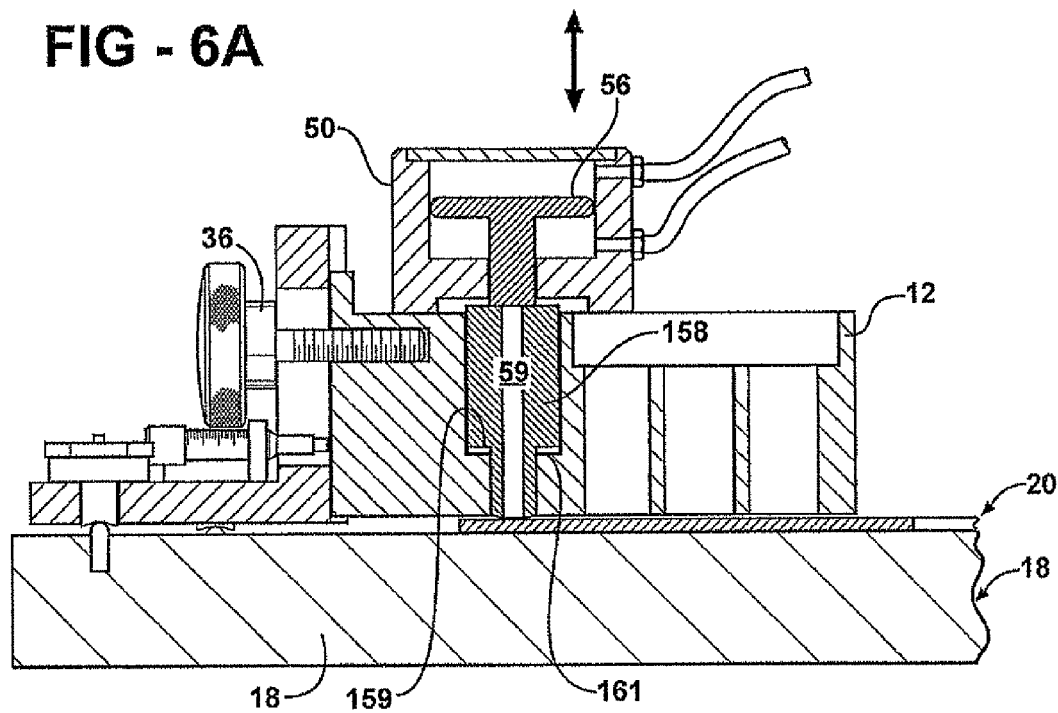
FIG. 6A illustrates an alternate configuration of an air cylinder and air cylinder shaft.

With reference to FIG. 6A, there is shown an alternate configuration of an air cylinder and air cylinder shaft. As shown in FIG. 6A, shaft 158 includes a shoulder 159. When air cylinder 152 engages shaft 158 to its fullest extent, shoulder 159 will engage a flange 161 machined internally into load frame 12. By setting the location of flange 161, the distance that shaft 158 protrudes beyond fences 13 may be fixed. The location of flange 161 may be set by precisely machining load frame 12 or in the alternative flange 161 may be raised or lowered by use of shims. The shims used to raise or lower flange 161 would not have to be replaced each time test plate 20 is replaced insofar as the shims would merely fix the distance shaft 158 protruded beyond fences 13.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An electronic component handler comprising:
a removable tool received on the handler;
a linear bearing mounted to the handler;
a test accessory mounted to the linear bearing and facing a surface of the tool, the test accessory movable between a first position and a second position within the linear bearing, the first position and the second position spaced apart in a direction perpendicular to the surface of the tool; and
a setting post mounted to the test accessory, the setting post extendable through the test accessory in a direction of the tool and facing the surface of the tool to define a gap between the test accessory and the tool when the test accessory is in its second position.

2. The electronic component handler as in claim 1 wherein the linear bearing further includes a lock operable to lock the test accessory in its second position.

3. The electronic component handler as in claim 1 wherein the test accessory is a load frame that supports a plurality of electronic components for loading into the tool.

4. The electronic component handler as in claim 3 wherein the tool defines a first plane and the load frame includes fences that define a second plane and the linear bearing is mounted to the handler with a kinematic coupling configured to adjust the second plane so that the first and second planes are coplanar.

5. The electronic component handler as in claim 4 wherein the gap is between 1 micron and 50 microns.

6. The electronic component handler as in claim 3 wherein the removable tool is a test plate including a plurality of concentric rows of test seats.

7. The electronic component handler as in claim 6 wherein the load frame includes a plurality of arcuate fences; the load frame being radially adjustable so as to position at least one of the fences adjacent to at least one of the concentric rows of test seats.

8. An electronic component handler comprising:
a removable tool received on the handler;
a linear bearing mounted to the handler;
a test accessory mounted to the linear bearing, the test accessory movable between a first position and a second position; and
a setting post mounted to the test accessory, the setting post extendable to define a gap between the test accessory and the tool when the test accessory is in its second position; and wherein the setting post is a pneumatic cylinder having an extendable shaft.

9. The electronic component handler as in claim 8 wherein the shaft is configured to extend no further than a shoulder.

10. In an electronic component handler including a removable test plate mounted thereto, the test plate including a plurality of concentric test seats for receiving electronic components and a load frame including a plurality of fences, the load frame being positioned proximate to the test plate and configured to direct electronic components into the test seats, the improvement comprising:
a linear bearing mounted to the handler with the load frame mounted thereto;
the load frame movable between a first position wherein the load frame is distal from the test plate and a second position wherein the load frame is proximate the test plate; and
a setting post mounted to the load frame for movement therewith, the setting post operable to define a gap between the load frame and the test plate when the load frame is in its second position; and wherein the setting post includes an air cylinder having a shaft that is extendable and retractable from the load frame; and the shaft configured to extend when the load frame is in its second position to define the gap between the load frame and the test plate.

11. The improvement as in claim 10 wherein the shaft includes a passage having air flowing there through such that when the load frame moves from its first position to its second position, the shaft is configured to come in close proximity thereby disrupting the air flowing through the passage to define the gap between the load frame and the test plate.

12. The improvement as in claim 11 further comprising a lock operable to lock the load frame in its second position.

13. The improvement as in claim 12 wherein the shaft is configured to extend no further than a flange.

14. The improvement as in claim 10 wherein the linear bearing is mounted to the handler with a kinematic coupling.

15. The improvement as in claim 10 wherein the load frame is radially adjustable relative to the concentric test seats.

16. The improvement as in claim 15 further comprising a micrometer configured to radially adjust the load frame.

17. In an electronic component handler including a removable test plate mounted thereto, the test plate including a plurality of concentric test seats for receiving electronic components and a load frame including a plurality of fences, the load frame being positioned proximate to the test plate and configured to direct electronic components into the test seats, the improvement comprising:
- a linear bearing mounted to the handler with the load frame mounted thereto;
- the load frame movable between a first position wherein the load frame is distal from the test plate and a second position wherein the load frame is proximate the test plate;
- a setting post mounted to the load frame for movement therewith, the setting post operable to define a gap between the load frame and the test plate when the load frame is in its second position; and
- at least one borehole to permit inspection of the gap.

18. In an electronic component handler including a removable test plate mounted thereto, the test plate including a plurality of concentric test seats for receiving electronic components and a load frame including a plurality of fences, the load frame being positioned proximate to the test plate and configured to direct electronic components into the test seats, the improvement comprising:
- a linear bearing mounted to the handler with the load frame mounted thereto;
- the load frame movable between a first position wherein the load frame is distal from the test plate and a second position wherein the load frame is proximate the test plate; and
- a setting post mounted to the load frame for movement therewith, the setting post operable to define a gap between the load frame and the test plate when the load frame is in its second position; wherein at least a portion of the setting post extends through the load plate and faces a surface of the test plate.

* * * * *